United States Patent [19]
Nasby

[11] Patent Number: 6,013,950
[45] Date of Patent: Jan. 11, 2000

[54] SEMICONDUCTOR DIODE WITH EXTERNAL FIELD MODULATION

[75] Inventor: Robert D. Nasby, Albuquerque, N.Mex.

[73] Assignee: Sandia Corporation, Albuquerque, N.Mex.

[21] Appl. No.: 08/245,785

[22] Filed: May 19, 1994

[51] Int. Cl.[7] .......................... H01L 23/40; H01L 23/52; H01L 29/40

[52] U.S. Cl. .......................... 257/734; 257/767; 257/774; 257/295; 257/66

[58] Field of Search .................................... 257/734, 736, 257/738, 767, 768, 774, 743, 748, 66, 314, 295, 288, 471; 365/175, 145

[56] References Cited

U.S. PATENT DOCUMENTS

| | | | |
|---|---|---|---|
| 2,791,758 | 5/1957 | Looney | 257/431 |
| 2,791,759 | 5/1957 | Brown | 257/431 |
| 2,791,761 | 5/1957 | Morton | 340/173 |
| 3,651,384 | 3/1972 | Waters et al. | 257/471 |
| 3,875,567 | 4/1975 | Yamazaki | 340/173 |
| 4,920,513 | 4/1990 | Takeshita et al. | 365/175 |
| 5,099,305 | 3/1992 | Takenaka | 357/51 |
| 5,162,880 | 11/1992 | Hazama | 257/106 |
| 5,198,994 | 3/1993 | Natori | 365/145 |
| 5,229,309 | 7/1993 | Kato | 437/43 |
| 5,307,305 | 4/1994 | Takasu | 257/77 |

FOREIGN PATENT DOCUMENTS 0583199  9/1959  Canada ................................ 365/145

OTHER PUBLICATIONS

"Vertical Diode–Capacitor Memory Cells", IBM Technical Disclosure Bulletin, Chang et al. vol. 15 No. 9 Feb. 1973. pp. 2887–2889.

"Physics of Semiconductor Devices" Bell Laboratories Incorporated. S. M. Sze, p. 64.

*Primary Examiner*—Mahshid Saadat
*Assistant Examiner*—Jhihan B Clark
*Attorney, Agent, or Firm*—John P. Hohimer

[57] ABSTRACT

A non-destructive-readout nonvolatile semiconductor diode switching device that may be used as a memory element is disclosed. The diode switching device is formed with a ferroelectric material disposed above a rectifying junction to control the conduction characteristics therein by means of a remanent polarization. The invention may be used for the formation of integrated circuit memories for the storage of information.

21 Claims, 5 Drawing Sheets

SEMICONDUCTOR DIODE WITH EXTERNAL FIELD MODULATION

This invention was made with Government support under Contract No. DE-AC04-94AL85000 awarded by the U.S. Department of Energy. The Government has certain rights in the invention.

FIELD OF THE INVENTION

The present invention relates to integrated circuits (ICs) and information storage and, more particularly, to a nonvolatile semiconductor diode switching device which may be used as a memory element in an IC for information storage. The present invention also relates to electrically re-writable nonvolatile memories which employ a ferroelectric material.

BACKGROUND OF THE INVENTION

Nonvolatile semiconductor memory elements are useful in that they allow the storage of information in an unpowered state. Such nonvolatile memory elements incorporating ferroelectric materials represent an advance over other types of nonvolatile memory elements such as electrically erasable and programmable read only memories (EEPROMs) in terms of data transfer rate, fatigue, radiation hardness, lower programming voltage, smaller cell size, and other characteristics. In a nonvolatile semiconductor memory element comprising a ferroelectric material with an electrically switchable polarization state, the write and read times are both potentially fast and substantially the same in principle for most configurations; and the polarization state is maintained even if the electrical power is removed, making this nonvolatile memory ideal for many applications.

Many different types of ferroelectric memory elements are represented in the prior art. These ferroelectric memory elements may be further classed as destructive readout devices and non-destructive readout devices.

U.S. Pat. Nos. 5,099,305 and 5,229,309 disclose destructive readout nonvolatile memory elements incorporating a capacitor having a ferroelectric dielectric material between two conductor layers. This ferroelectric capacitor is electrically connected to the source or drain of a transistor. The polarization of the ferroelectric material is utilized to indicate one of two possible logic states for the data stored in the memory element. To write data into the ferroelectric capacitor memory element, the ferroelectric dielectric film is polarized in a positive or a negative state by the application of a positive or negative electric field across the capacitor. To read the stored data from the ferroelectric capacitor memory element, a read voltage must be applied to the capacitor to determine the polarization state. If the read voltage is the opposite polarity from the original write voltage, a substantial charge flow results from the polarization reversal in the capacitor. If the read voltage has the same polarity as the original write voltage, the polarization of the capacitor is not reversed, and little if any charge flow occurs. The different in the charge flow response (i.e. current) of the capacitor during readout indicates the logic state of the stored data.

After a read, the original data is restored in the capacitor. In the first case above (the read voltage having the opposite polarity of the original write voltage) the polarization must be inverted twice (i.e. switched from one polarization state to the opposite polarization state). The first polarization inversion is required to determine the stored logic state (i.e. to read out the data), and the second polarization inversion is required to re-establish (i.e. re-write) the data to be stored in the memory element. For the second case (the read voltage having the same polarity of the original write voltage), no polarization inversion is required to determine the stored logic state.

The logic state of the stored data in a given capacitor determines whether or not the polarization must be inverted for a read, and the stored bits could remain the same or switch continually for each read. This continual inversion of the ferroelectric polarization is a disadvantage of this type of memory element since it fatigues the ferroelectric film which fails to function normally after it has undergone inversion of polarization some number of times depending on the particular technology. In addition, the stored information is vulnerable to loss by a power failure or other effect during the time between the first inversion of the ferroelectric polarization to read out the stored information and the second inversion of the polarization to re-establish the data storage in the memory element.

The above disadvantages of destructive readout nonvolatile memory elements may be overcome by the development of non-destructive readout nonvolatile memory elements that do not change the polarization state of the ferroelectric material during a read. Such non-destructive read nonvolatile memory elements may be based on transistors, resistors, or diodes using a stored electric charge or polarization to indicate a memory state.

U.S. Pat. No. 5,198,994 discloses a non-destructive readout nonvolatile semiconductor memory element comprising a field-effect transistor (FET) having a ferroelectric gate dielectric film. The polarization state of the ferroelectric material affects the threshold voltage of the FET and thereby indicates the stored data. The ferroelectric material does not need to be polled to sense the state of the stored data. However, a voltage does need to be applied across the source-drain of the FET (and a voltage to the FET gate) to read the data; and this voltage must be sufficiently small to not disturb the ferroelectric polarization state.

U.S. Pat. No. 5,070,385 discloses a non-destructive readout ferroelectric nonvolatile variable resistor memory element in which the resistance of a semiconductor layer is controlled by the degree of polarization of an overlying ferroelectric layer. The resistance of this resistor element may be changed in a continuous manner resulting in a large number of possible resistance states as may be required for the development and programming of neuro-networks. To read the resistance state of this memory element, a voltage must be applied across the resistor; and this voltage must be sufficiently small to not disturb the ferroelectric polarization state.

U.S. Pat. No. 2,791,758 discloses a non-destructive readout semiconductor switch that is essentially a linear resistance having two stable states of operation, one offering a relatively high impedance and the other a relatively low impedance, with the resistance state controlled and determined by an overlying ferroelectric material. This semiconductor switch incorporates a semiconductor diode operated in a reverse-bias mode to restrict the current conduction path to an isolated surface region proximate to the ferroelectric material.

A disadvantage of the prior art memory element of U.S. Pat. No. 2,791,758 is that it is not in an integrated form; and the ferroelectric material is not deposited as a thin film on a surface of the memory element. Instead, this prior art memory element is fabricated in a hybrid form, with the ferroelectric material in wafer form (preferably a single crystal) positioned as close as possible to the semiconductor surface. Even with substantial precautions, this prior art memory element suffers from air gaps at the semiconductor-ferroelectric interface. In such case, the major portion of any applied voltage will occur across this gap rather than across the high-dielectric-constant ferroelectric material, and there is a likelihood of an electrical breakdown at this interface. To prevent such an electrical breakdown, a flowable dielectric filler material is used to fill the air gaps between the ferroelectric wafer and the semiconductor surface. This prior art bistable device as disclosed makes no provision for isolating the memory element on a semiconductor substrate (as, for example, by using a patterned insulating layer), and no means are disclosed for incorporating a plurality of memory elements of this design on a semiconductor substrate in the form of an IC.

U.S. Pat. No. 2,791,759 discloses a non-destructive readout semiconductor diode memory element with a ferroelectric material in the form of a thin wafer, preferably a single crystal (i.e. monocrystalline), positioned close to a semiconductor surface and acting to control the conductivity type of the closely adjacent portion of the semiconductor. In one state of polarization of the ferroelectric material, the conductivity type of the adjacent portion of the semiconductor is such that a reverse-biased rectifying junction is formed resulting in a high impedance in the semiconductor; while, in another state of polarization, the conductivity type of the adjacent portion of the semiconductor is such that there is no appreciable rectifying junction resulting in a low impedance in the semiconductor.

U.S. Pat. No. 2,791,759 also has the disadvantages that it is not in an integrated form and that the ferroelectric material is not deposited as a thin film on a surface of the memory element (i.e. the ferroelectric material is not in intimate contact with the semiconductor surface). Instead, this prior art memory element is fabricated in a hybrid form, with the ferroelectric material wafer positioned as close as possible to the semiconductor surface. The unavoidable air gaps at the ferroelectric-semiconductor interface in this prior art memory element results in the preferable use of a ferroelectric material having a low dielectric constant (and a low remanent polarization) to minimize the possibility of dropping most of any applied voltage across the air gap and deleteriously affecting the memory performance of the ferroelectric element. This prior art bistable device as disclosed makes no provision for isolating the memory element on a semiconductor substrate (as, for example, by using a patterned insulating layer). And, this lack of isolation results in regions of the semiconductor p-n junction (where the electrodes make contact to the diffused layer) that are not subject to control by the electrical field produced by the ferroelectric material. In addition, the lack of isolation prevents the formation of an array of memory elements on a semiconductor substrate as in an IC.

U.S. Pat. No. 2,791,761 discloses another non-destructive readout semiconductor diode memory element in which a ferroelectric material (preferably a crystal having a low dielectric constant) is mounted against a surface of the semiconductor in the rectifying barrier region (i.e. with the electric field direction of the ferroelectric material parallel to the semiconductor p-n junction). In this manner, the polarization state of the ferroelectric material is used to alter the reverse conductivity characteristics of the rectifying p-n junction.

U.S. Pat. No. 2,791,761 suffers from many of the same disadvantages as U.S. Pat. Nos. 2,791,758 and 2,791,759. In order to mount the ferroelectric material as close to the semiconductor surface as possible in this design, consider-able time, effort, and expense are required to produce smooth mating surfaces on the ferroelectric and semiconductor by grinding, polishing, or cleaving techniques. In addition it is desirable to interpose a dielectric material such as a wax or liquid having a high dielectric constant between the ferroelectric and semiconductor for improved performance and to prevent an electrical breakdown since the ferroelectric programming voltage for an inversion of the polarization of the ferroelectric material may vary from less than 200 volts to as large as 500 volts. This prior art device is not disclosed as being capable of being for med as an isolated device on a substrate; and there is no teaching of the possibility of depositing the ferroelectric material as a thin film on a surface of the memory element In addition, this prior art memory element as disclosed is incapable of being incorporated into an IC as is desirable for the formation of an array of memo or elements; and the required ferroelectric programming voltage is far in excess of the about 5 volts preferred for ICs.

SUMMARY OF THE INVENTION

It is a primary object of the present invention is to obviate the foregoing problems peculiar to the prior art nonvolatile semiconductor memory elements.

An object of the invention is to alter selectively the electrical characteristics of a semiconductor diode memory element by the application of a momentary electrical impulse (i.e. a ferroelectric programming voltage, also termed a switching voltage), and to maintain the memory element in one of two conductive conditions without continuously expending energy.

A further object of the invention is to store information which can be readout without destruction of the stored information.

Another object of the invention is to provide an improved programmable nonvolatile semiconductor diode memory element that has a small memory cell area, a low cost, and that has a fast information write-in and readout times.

A further object of the invention is to provide programmable control or switching functions and logic.

Another object of the invention is to provide a non-destructive readout semiconductor memory element that is not prone to fatigue under conditions of frequent and successive readout.

Still another object of the invention is to provide an integrated memory array constructed on a semiconductor wafer in the form of an IC including additional circuitry for addressing individual memory elements in the array.

To this end, according to one aspect of the invention, there is provided a semiconductor rectifying junction device in which a ferroelectric material film is integrated on a semiconductor substrate above a rectifying junction; and an electric field component is generated by a polarization of the ferroelectric material film, with the electric field component acting upon the rectifying junction to modify a forward-bias effective turn-on voltage therein.

According to another aspect of the invention, the rectifying junction may be in the form of a Schottky-barrier junction, or as a semiconductor heterojunction, or as a semiconductor p-n junction.

Additional objects, advantages, and novel features of the invention will become apparent to those skilled in the art upon examination of the following detailed description when considered in conjunction with the accompanying drawings. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating a preferred embodiment of the invention and are not to be construed as limiting the invention. In the drawings.

Figure 1:
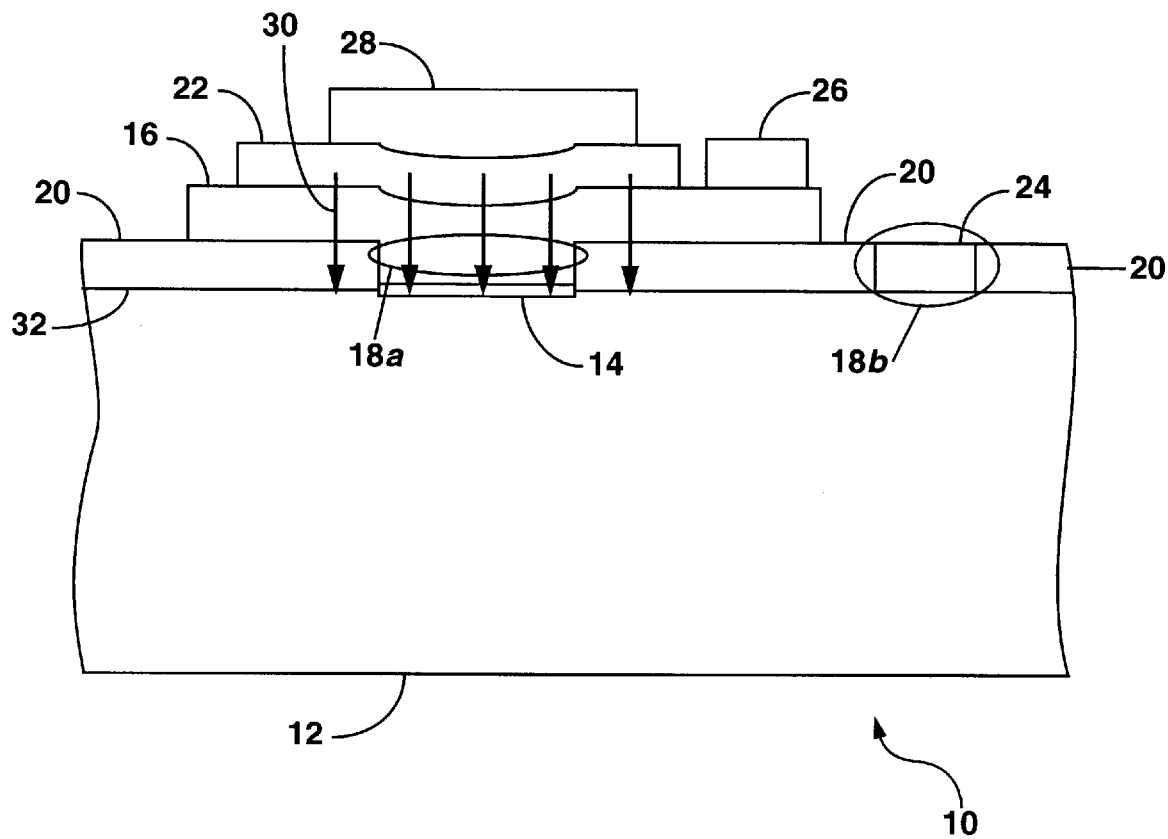
FIG. 1 shows a cross-sectional view of a non-destructive-readout nonvolatile semiconductor diode memory element 10 according to the present invention.

Those structures depicted in the drawings are arranged for illustrative purposes and therefore are distorted in their proportions. The thickness of the semiconductor substrate 12 is chosen on the basis of convenience for manufacture and is not significant in the operation of the device other than as a thermal heat sink and mechanical support. The cross-sectional area of the rectifying junction parallel to the plane of the substrate 12 is determined by the semiconductor processing capabilities and the required electrical current flow characteristics of the device, with a larger cross-sectional area producing a larger current flow.

DETAILED DESCRIPTION OF THE INVENTION

The non-destructive-readout nonvolatile semiconductor diode memory element of the present invention is shown schematically in FIG. 1. The memory element is formed with at least one electric field generating layer disposed above a rectifying junction, with an electric field component (having a direction substantially perpendicular to the rectifying junction) penetrating into one or both of the materials forming the rectifying junction and affecting a space-charge field therein, thereby altering a current versus voltage (I–V) characteristic of the rectifying junction. When the electric field generating layer is electrically activated as may be the case for a polarizable dielectric material such as a ferroelectric material, or a stored charge (generated, for example, by a tunneling current) in an insulating layer, or an electrically floating gate (i.e. a conducting gate material above an insulating layer) then the shift in the I–V characteristic of the rectifying junction may be controlled and shifted in voltage by the application of a programming voltage. And, if the electric field generating layer has a remanent electric field component that remains in the region of the rectifying junction after all electrical power is removed from the memory element (as may be the case for a polarized ferroelectric material or a stored charge in an insulating layer), then the logic state of the memory element is retained; and the memory element is termed nonvolatile.

In FIG. 1, a semiconductor switching device 10 that may be used as a non-destructive-readout nonvolatile memory element is shown according to the present invention. This semiconductor switching device 10 may be formed as a single three-terminal component or it may be formed as an array of individually addressable memory elements in an IC, with the array further comprising transistors, resistors, and other components as known to the art for addressing the individual memory elements in the array by addressing means including bit-line and word-line addressing. The semiconductor switching device 10 in array form or as one or more discrete devices may also comprise a programmable memory or control portion of an IC that includes other functionalities (for example, an IC microcontroller or a neural network or a logic control circuit).

In FIG. 1, the semiconductor switching device 10 of the present invention comprises: a semiconductor substrate 12, a rectifying junction 14 formed on or within a device surface 32 of the substrate 12 by a patterned electrically conductive material 16 in contact with the semiconductor substrate 12 through a contact hole 18a formed in a patterned first insulating layer 20, and an electric field generating layer 22 formed above the electrically conductive material 16 in the vicinity of the rectifying junction 14.

The rectifying junction 14 of the semiconductor switching device 10 in FIG. 1 is electrically contacted by means of a pair of electrodes connected to opposite sides of the rectifying junction 14, with a first electrode 24 being connected to the semiconductor substrate 12 and a second electrode 26 being connected to the patterned conductive material 16. This second electrode 26 in combination with the patterned conductive material 16 may also serve as a lower electrical contact to the electric field generating layer 22. A third electrode 28 is connected to the electric field generating layer 22 as an upper electrical contact.

The semiconductor substrate 12 is preferably silicon, although other types of semiconductor substrate materials including gallium arsenide may be used in carrying out the present invention. The substrate doping may be n-type doping, or p-type doping, or undoped (semi-insulating), or the substrate may include one or more epitaxial layers formed thereon with differing dopant concentrations for different embodiments of the present invention (for example, an n-doped layer formed on an n$^+$-doped layer).

As an example, in the case of a Schottky-barrier junction semiconductor switching device 10, an n-doped active region of the substrate 12 is generally to be preferred with an impurity doping concentration of about $10^{17}$ cm$^{-3}$ or less; whereas for a deposited or diffused semiconductor p-n junction semiconductor switching device, a p-doped substrate 12 may be preferred with an impurity doping concentration of about $10^{17}$ cm$^{-3}$ or more. And, in the case of an IC according to the present invention having an array of closely-spaced semiconductor switching devices with diffused p-n junctions, a lower-doped substrate 12 is preferred with an impurity doping concentration of about $10^{16}$ cm$^{-3}$ or less and having a higher impurity doping in the diffused p-n junction region.

A first insulating layer 20 such as, for example, a grown or deposited silicon dioxide layer with a thickness of about 100 nanometers is formed on the substrate 12 for device isolation. Alternately, the first insulating layer 20 may comprise a silicon dioxide layer with a TiO$_2$ layer formed thereupon to improve the adhesion and the compatibility with the patterned conductive material 16; or the first insulating layer 20 may be in the form of a TiO$_2$ layer. The first insulating layer 20 acts as an isolation layer to define the area of the rectifying junction 14 and to separate the semiconductor switching device 10 from adjacent switching devices 10 or additional components (for example, transistors for addressing an array of switching devices 10, or resistors for limiting the current flow in the switching devices 10) formed on the semiconductor substrate 12.

The first insulating layer 20 is patterned to form contact holes (i.e. regions of access to the semiconductor substrate) 18a and 18b that penetrate through the first insulating layer 20 to the substrate 12. These contact holes 18a and 18b are formed by the removal of material from the first insulating layer 20, preferably by etching (for example, dry etching such as reactive-ion etching) using a photolithographically defined resist pattern that is removed after the etching step.

After patterning the first insulating layer 20, an electrically conductive material 16 is formed on or within the substrate 12 to produce the rectifying junction 14 in combination with the substrate 12. The rectifying junction 14 may be a p-n homojunction, or a p-n heterojunction, or a Schottky-barrier junction depending on the electrically conductive material 16 used in carrying out the present invention. For example, if the electrically conductive material 16 is a metal (including Pt, Ru, Mo, Ti, W, Ta, Pd, Au, Al, Os, Ir, Rh, Cr, and Ni) or a conductive metal oxide (including the oxides of Ru, Re, Rh, Os, Ir, Ni, Sn, and InSn; and complex oxides such as yttrium-copper-barium-oxide, lanthanum-strontium-cobalt-oxide, and the like as may be used for superconductors) or a conductive metal silicide that is preferably deposited on an n-type silicon substrate, then a Schottky-barrier junction will be formed. (Pt and $RuO_2$ may be preferable for the formation of a Schottky-barrier junction due to their compatibility with many ferroelectric dielectric materials.) If the electrically conductive material 16 is a semiconductor of a different material and dopant type (i.e. the opposite doping polarity) than the substrate 12, then a heterojunction rectifier will be formed (for example, a tin oxide n-type semiconducting material deposited on a p-type silicon substrate; or a p-doped aluminum gallium arsenide semiconducting material deposited on an n-doped gallium arsenide substrate). Additionally, the electrically conductive material 16 may be of the same material type as the substrate 12 (but having a second conductivity type opposite that of the semiconductor substrate), in which case, the rectifying junction will be a homojunction (as, for example, an n-doped polysilicon electrically conductive material 16 deposited on a p-doped silicon substrate 12).

The electrically conductive material 16 may also be formed within the semiconductor substrate 12 below the device surface 32 as, for example, by ion implanting or diffusing an n-type impurity dopant through an access region in the first insulating layer 20 into a p-type semiconductor substrate 12, and activating the impurity dopant to form a buried diffused p-n rectifying junction 14.

The rectifying junction 14 is preferably of uniform dimensions in the plane of the junction (for example, circular or square) with a junction area determined by the required current carrying capacity of the load placed in series with the semiconductor diode switching device 10 or by the overall IC design rules and device density requirements. For example, in using the semiconductor switching device 10 as a memory element in an IC, the required current carrying capacity may be of the order of milliamperes or less, and the lateral dimensions of the rectifying junction 14 may be several microns or less.

Figure 4:
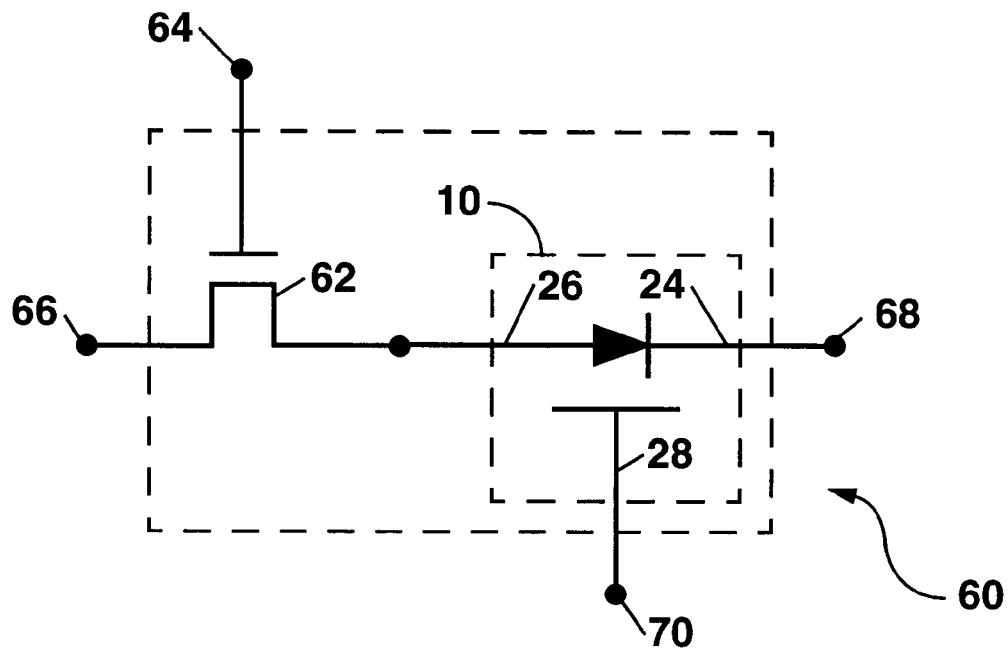
FIG. 4 illustrates a memory cell formed from the semiconductor switching device of the present invention.

The patterned electrically conductive material 16 is preferably deposited on the semiconductor substrate 12 as shown in FIG. 1 by sputtering or evaporation in the case of a metal, and by sputtering in the case of a metallic oxide, and by a chemical vapor deposition (CVD) process in the case of a semiconductor. Patterning of the electrically conductive material 16 is preferably performed with the use of a resist layer as a mask. The resist layer is spun on above the first insulating layer 20 and then exposed to allow removal of the resist in the region of the rectifying junction 14. After deposition of the electrically conductive material 16, etching or lift-off methods are used to pattern the electrically conductive material 16. The electrically conductive material 16 may be patterned as described above to form a single isolated semiconductor switching device 10 on a substrate 12 or an array of isolated switching devices 10 as shown in FIG. 4.

A primary requirement for the electrically conductive material 16 is that it be sufficiently thin for the electric field component 30 produced by the electric field generating layer 22 to penetrate into the electrically conductive material 16 to the region of the rectifying junction 14 to modify the I–V characteristic therein. The preferred thickness of the electrically conductive material 16 will depend on its material composition and electrical conductivity. The preferred thickness of the electrically conductive material 16 may be, for example, in the range of about 5 to about 20 nanometers in the case of a metal used for forming a Schottky-barrier junction; and it may be in the range of about 50 to about 100 nanometers or more for a semiconductor material with a low impurity doping level used for forming a p-n junction.

The electric field generating layer 22 is preferably a patterned layer of a ferroelectric material. Ferroelectric materials are defined as those materials that, even in the absence of an applied electric field, have an effective center of positive charge that does not coincide with the effective center of negative charge, so that the material exhibits a spontaneous electric dipole moment and is characterized by a spontaneous or remanent polarization. The sense of the spontaneous polarization (i.e. the polarization direction) can ordinarily be reversed by an applied electric field. The minimum intensity of electric field which is necessary to apply to reverse the direction of spontaneous polarization is related to the coercive field of the ferroelectric material. The characteristics of ferroelectric materials are described more fully in a book entitled "*Introduction to Solid State Physics*" by C. Kittel, chapter 13, pages 399–431, published by John Wiley & Sons (1976).

Examples of ferroelectric materials include the families of balium-titanates, bismuth-titanates, barium-magnesium-fluorides, lead-titanates, lead-zirconate-titanates (PZT), lanthanum-lead-zirconate-titanates (PLZT) and the like. In the present invention, the ferroelectric material is preferably PZT when the electrically conductive material 16 is Pt or $RuO_2$ to form a Schottky-diode and provide an electrical connection to the ferroelectric material. The bismuth-titanate family of materials or the barium-magnesium-fluoride family of materials are preferred for embodiments of the invention in which the ferroelectric material may be in contact with silicon or silicon compounds.

The ferroelectric electric field generating layer 22 is a polycrystalline thin film layer with a thickness of about 300 nanometers formed preferably by a sol-gel method with present technology. Other deposition methods that are under development for forming the ferroelectric layer 22 include sputtering, chemical vapor deposition (CVD), and the like. The electric field generating layer 22 may be patterned by conventional semiconductor processing methods to form an isolated region of ferroelectric material as shown in FIG. 1.

If an array of semiconductor switching devices 10 are formed (for example, in an IC memory for the storage of information), then the ferroelectric layer 22 may be patterned to form a plurality of isolated ferroelectric regions if necessary, each region being in the vicinity of a rectifying junction 14.

The first electrode 24 is connected to the substrate 12 through the contact hole 18b which is formed by conventional photolithography and etch techniques. The second electrode 26 is connected to the patterned electrically conductive material 16; and the third electrode 28 is connected to the electric field generating layer 22. An electrical potential (i.e. a voltage) is applied between the first electrode 24 and the second electrode 26 to bias the rectifying junction 14 in either a forward direction of electrical conduction (i.e. a forward-biased state) or a reverse direction of electrical conduction (i.e. a reverse-biased state). In the present invention, the preferred mode of operation of the rectifying junction 14 is in the forward-biased state wherein the electrical conduction characteristic (i.e. the current-versus-voltage characteristic) of the rectifying junction 14 may be altered and shifted in voltage by the electric field component 30.

The electrodes 24, 26, and 28 may include additional electrical conductors as may be required for electrical interconnections to connect the semiconductor switching device 10 to other elements on the substrate 12 including bit lines and word lines for addressing the semiconductor switching device 10 as a memory element in an array. Additional contact holes 18 and metal vias (as, for example, to electrodes 26 and 28) may be used when the semiconductor switching device 10 comprises one or more insulating passivation layers or intermetal dielectric layers for protection from the environment and for the isolation of a plurality of device electrical interconnections.

The material composition of the electrodes 24, 26, and 28 may be identical or it may be different for each of the electrodes 24, 26, and 28 depending on compatibility requirements with the underlying material. For example, if electrically conductive material 16 is a metal or conductive metal oxide or conductive metal silicide for forming a Schottky-barrier junction, then electrode 26 may be formed from the same conducting material, or the electrically conductive material 16 may comprise electrode 26.

In the case of the electrode 28 contacting the electric field generating layer 22, there are special considerations when the electric field generating layer 22 is a ferroelectric material. In this case, the electrode 28 is preferably substantially electrochemically inert with respect to the ferroelectric material. If, for example, PLZT materials are used for the ferroelectric layer 22, the electrode 28 may be constructed from an appropriate metal such as Pt or a conducting metal oxide such as $RuO_2$ or other oxides known to be chemically compatable with ferroelectric materials. Since such oxides are already stabilized against oxygen ions, any oxygen drifting from the PLZT material will not result in an insulator being formed at the interface of the ferroelectric layer 22 and the electrode 28. However, it will be apparent to those skilled in the art that bromides, carbides, silicides, nitrides, and sulfides may also be utilized. The electrode 28 must also be capable of deposition on ferroelectric layer 22 without destroying ferroelectric 22. For example, if a PLZT material is used for ferroelectric layer 22, the material used for electrode 28 must be depositable in a sufficiently non-reducing atmosphere and at a suitably low temperature.

The preference for a substantial degree of electrochemical inertness of materials in contact with the electric field generating layer 22 also applies to the electrically conductive material 16. The electrically conductive material 16 and the rectifying junction 14 must be compatible with the processes used for forming the electric field generating layer 22. When the electric field generating layer 22 is formed from a ferroelectric material, it typically must undergo a firing or sintering process that may be performed at an elevated temperature. For example, if a ferroelectric material such as PZT is used as the electric field generating layer 22, the elevated processing temperature may be about 600 degrees Celsius. In the case of a Schottky-barrier junction semiconductor switching device 10, the electrically conductive material 16 is preferably formed from materials including Pt or $RuO_2$ that are known to be chemically compatable with ferroelectric materials and that can undergo elevated temperature processing.

The ferroelectric electric field generating layer 22 is polarized by applying a programming voltage between the second electrode 26 and the third electrode 28 in FIG. 1. (If the rectifying junction is forward biased and in a conducting state, then the programming voltage may be applied between the first electrode 24 and the third electrode 28.) As the programming voltage is gradually increased either positively or negatively from zero, the ferroelectric layer 22 is gradually polarized until the polarization reaches a saturation value. If the intensity of the electric field in the ferroelectric layer 22 produced by the programming voltage is reduced thereafter, the degree of the polarization decreases; but even when the programming voltage is reduced to zero, there remains a remanent polarization level in the ferroelectric material. This remanent polarization remains for a substantial time interval (up to many years) following the removal of the programming voltage, or until a programming voltage generating an opposing electric field sufficient to reverse the remanent electrical charge is applied across electrodes 26 and 28 to reverse (i.e. invert) the direction of the polarization in the ferroelectric material 22. The programming voltage may be in the form of an impulse with a time duration as short as several nanoseconds. When the ferroelectric layer 22 is about 100 to 500 nanometers thick, a relatively low programming voltage of about 5 volts or less is sufficient to invert the direction of the polarization in the ferroelectric material 22, making the semiconductor switching device 10 compatible with IC requirements.

The time to switch (i.e. invert) the polarization of the ferroelectric material may be as short as about one nanosecond; and the polarization may be switched up to $10^9$ times or more before significant fatigue occurs. (Some reported ferroelectric materials have been cycled to $10^{12}$ times with little or no fatigue; while other ferroelectric materials may fatigue significantly after being cycled $10^6$ times.) In the semiconductor switching device 10 of the present invention, the polarization inversion does not occur in the data readout mode as is the case of prior art destructive readout ferroelectric memory elements. Therefore, the present invention minimizes polarization cycling and extends the useful lifetime of the semiconductor switching device as a memory element.

The electric field component 30 produced by the electric field generating layer 22 penetrates into the electrically conductive material 16 to the region of the rectifying junction 14 as shown in FIG. 1. This electric field component 30, depending on its polarity, either adds to or subtracts from the internal space-charge field in the rectifying junction thereby modifying the built-in potential barrier and shifting the diode effective turn-on voltage. (The diode effective turn-on voltage is changed by the electric field component 30, although the diode impedance characteristic above the effective turn-on voltage remains substantially unchanged.) The characteristics of rectifying junctions are described more fully in the books entitled "*Semiconductor Physics and Devices, Basic Principles*" by D. A. Neamen, chapters 7–9, pages 239–369, published by Irwin Publishing Co. (1992) and "*Physics and Technology of Semiconductor Devices*" by A. S. Grove, chapter 6, pages 149–190, published by J. Wiley (1967).

Figure 2:
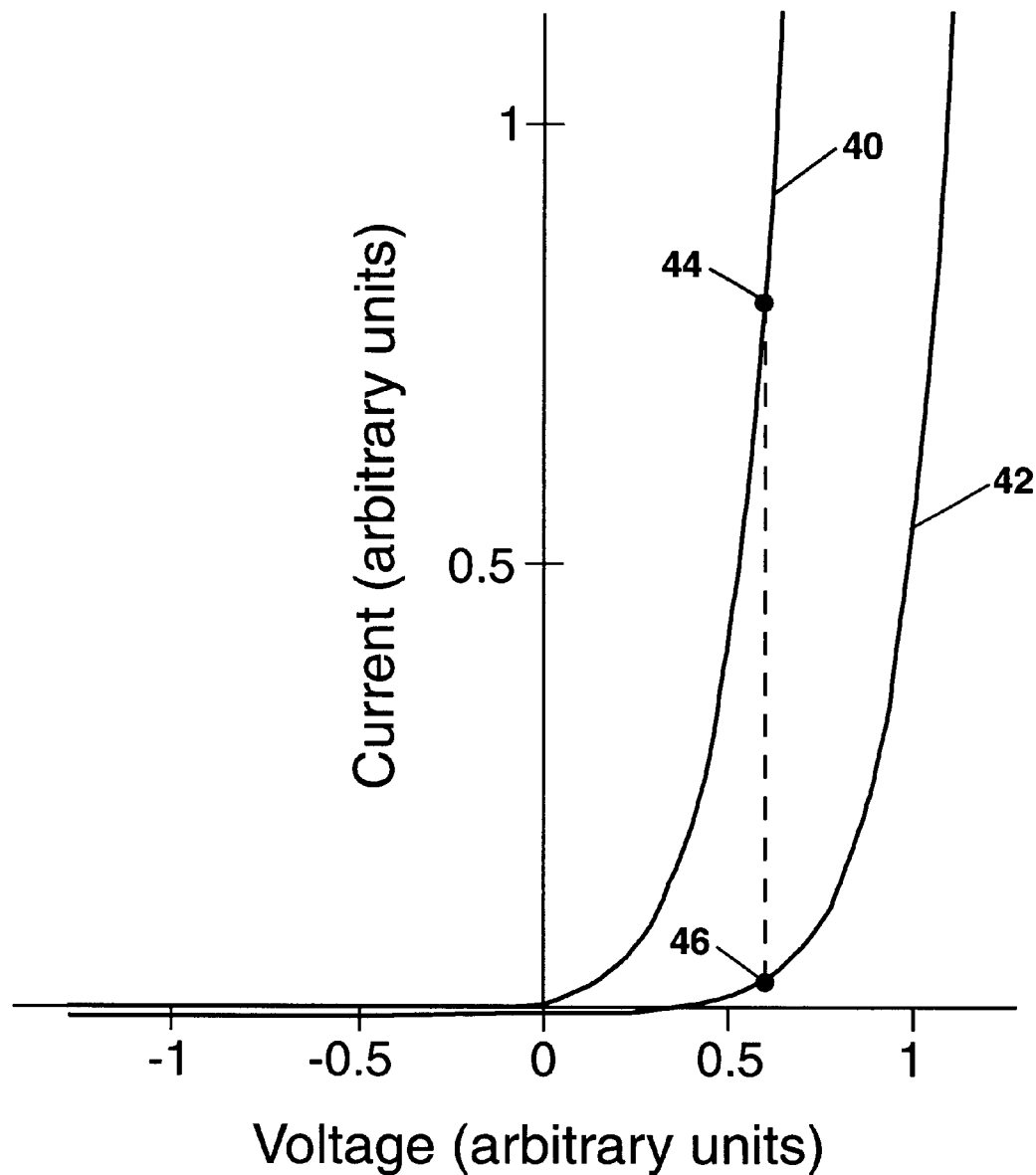
FIG. 2 shows the current-versus-voltage characteristics of a nonvolatile semiconductor diode memory element according to the present invention.

The effect of the electric field component 30 is manifested as a shift in the I–V characteristic curves of the semiconductor switching device 10 as is shown in FIG. 2. The voltage and current scales in FIG. 2 are shown in terms of arbitrary units to illustrate the behavior of the semiconductor switching device 10. The actual voltage and current scales will depend upon a particular embodiment of the invention (i.e. the lateral dimensions of the rectifying junction 14 and the materials comprising the rectifying junction). For example, in the case of a silicon diode switching device in an integrated circuit, the units in the voltage scale may be about the actual voltage across the rectifying junction 14 in volts, and the units in the current scale in FIG. 2 may be about the diode current in milliamperes.

In FIG. 2, the I–V curve labelled 40 corresponds to one direction of polarization of the ferroelectric layer 22 (i.e. with the electric field component 30 and the internal space-charge field being opposed), and this curve is shifted to slightly lower voltage than would be the case for the rectifying junction 14 in the absence of any electric field component 30. The I–V curve labelled 42 corresponds to the opposite direction of polarization (i.e. with the electric field component 30 and the internal space-charge field being in the same direction), and the curve 42 is shifted to higher voltages.

In FIG. 2, the shift in the two I–V curves along the voltage axis (i.e. the change in the diode effective turn-on voltage) will depend on the magnitude of the electric field component 30 in the region of the rectifying junction 14 to affect the built-in potential barrier therein; and this in turn will depend on the thickness and composition of the electrically conductive material 16 and ferroelectric layer 22, and the programming voltage applied to electrodes 26 and 28 to generate the remanent polarization. The effective turn-on voltage of a silicon diode switching device 10 in the absence of any electric field component 30 may be, for example, about 0.6 volts; and the shift in the effective turn-on voltage of the diode in the presence of the electric field component 30 may be about 0.1 volts. Although this may appear to be a small change in the diode effective turn-on voltage, the nonlinear response of the rectifying junction 14 to an applied forward-bias voltage may result in a large change in the diode current flow. This is an advantage of using a semiconductor diode as a switching element 10 as in the present invention.

FIG. 2 shows an example of this switching behavior for the semiconductor switching device 10 operated at a forward-bias voltage indicated by the vertical dashed line. (This forward-bias voltage may be, for example, about the diode effective turn-on voltage in the absence of any electric field component 30.) In this example, the I–V curve 40 in one polarization state of the device results in a relatively large current flow 44 in the semiconductor switching device 10; while in the opposite polarization state, the I–V curve 42 results in a relatively small current flow 46. For use as a memory element, the relatively large current flow 44 may be used to indicate one logic state (for example, a logical "1" state), and the relatively small current flow 46 may indicate the opposite logic state (for example, a logical "0" state). An initial state of polarization (i.e. an initial logic state in the memory element) may be established independent of the initial polarization state of the electric field generating layer 22 by applying a programming voltage which saturates the ferroelectric material in a preferred polarization direction.

Although the effect of the electric field component 30 on the rectifying junction has been described with reference to the semiconductor switching device 10 being operated in a forward-bias mode, it will be appreciated that the electric field component 30 also affects the I–V characteristics in the reverse-bias mode in a manner similar to that described in U.S. Pat. No. 2,791,761. The present invention may also be operated in the reverse-bias mode; and in such mode of operation, the present invention represents an improvement over the prior art of U.S. Pat. No. 2,791,761 in that the present invention may be formed as an IC having an array of semiconductor switching devices 10.

Figure 3:
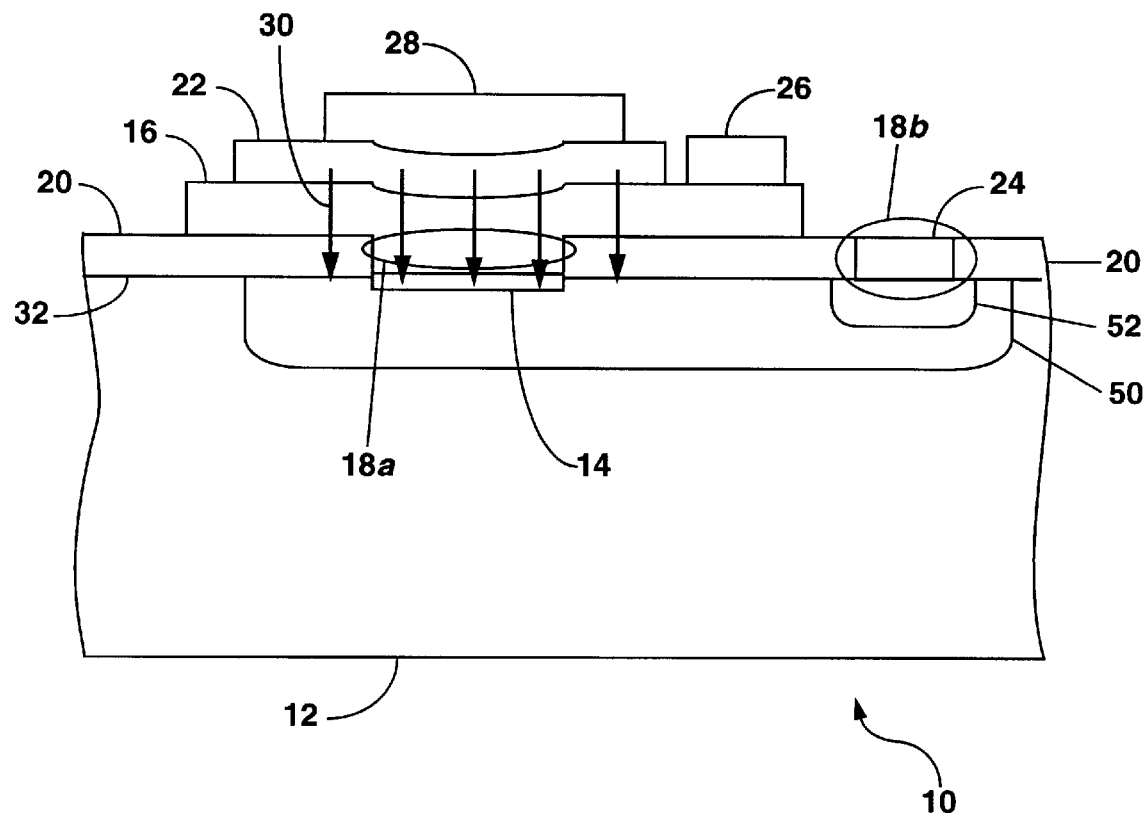
FIG. 3 shows a cross-sectional view of an alternative embodiment of a non-destructive-readout nonvolatile semiconductor diode memory element according to the present invention.

Another embodiment of the present invention is shown in FIG. 3. This embodiment of the invention is more detailed than that of FIG. 1 to indicate the formation of one or more closely-spaced semiconductor switching devices 10 in an IC (for example, an array of devices) by using doped wells in the semiconductor substrate 12 as known to the IC industry. This embodiment of the invention preferably uses a silicon substrate 12 in which an impurity doped diffusion region (i.e. well) 50 is formed near the device surface 32 as a part of the rectifying junction 14. The diffusion region 50 is formed using a photolithographic masking process. For example, one or more isolated p-doped diffusion regions 50 may be formed by ion implanting boron as an impurity dopant at a level of about $1\times10^{15} cm^{-2}$ into an n-doped substrate 12 through openings in a resist mask. The resist mask is then removed and the phosphorous impurity dopant is activated by a thermal diffusion process for about 30 minutes at 900 degrees centigrade to give an impurity dopant concentration of about $10^{17} cm^{-3}$.

Back biasing of the rectifying junction formed between diffusion regions 50 and the semiconductor substrate 12 isolates the diffused wells. In this example, a contact diffusion region 52 having a higher p-type doping level (i.e. $p^+$ as required for an Ohmic contact) may be formed through the contact hole 18b in the first insulating layer 20 by a second implant/ diffusion step. This embodiment of the invention may also include an n-doped diffusion region 50 in a p-doped substrate 12, and an n-doped contact diffusion region 52 as may be preferable, for example, for the formation of a Schottky-barrier junction semiconductor switching device 10.

The formation of the other elements of this second embodiment of the invention as shown in FIG. 3 may proceed as previously described with reference to the first embodiment of the invention, with the same considerations with regard to composition and function.

FIG. 4 shows an illustration of a memory cell 60 suitable for forming an array memory for the storage of information. The example of FIG. 4 is only for the purpose of illustration; and the diode polarity in the memory cell 60 may be reversed from that shown.

The memory cell 60 preferably comprises at least one access transistor 62 in series with the semiconductor switching device 10 to allow an individual memory cell in a memory array to be read or written. The access transistor 62, preferably a MOSFET transistor, allows the use of bit line and word line addressing methods.

A word line connection 64 to the memory cell 60 in FIG. 4 is made to the gate of the access transistor 62; and a bit line connection 66 is made to the drain or source of the transistor depending on the polarity of the transistor 62 and semiconductor switching device 10. The bit line connection 66 is preferably connected through the access transistor 62 to the second electrode 26 as shown in FIG. 4. This allows the bit line to be used in combination with the programming (i.e. plate) connection 70 to write a memory state as a remanent polarization in the ferroelectric material 22. A drive line connection 68 is made to the side of the rectifying junction of the semiconductor switching device 10 that is not connected to the access transistor 62. The memory state of the memory cell 60 is preferably read as a forward-bias conduction characteristic of the rectifying junction 14 as previously discussed with reference to FIG. 2. In the present invention, the read and write times are not linked as in prior art ferroelectric capacitor memories. The write time depends only on the characteristics of the ferroelectric layer 22; while the read time depends only on the characteristics of the rectifying junction 14.

Figure 5:
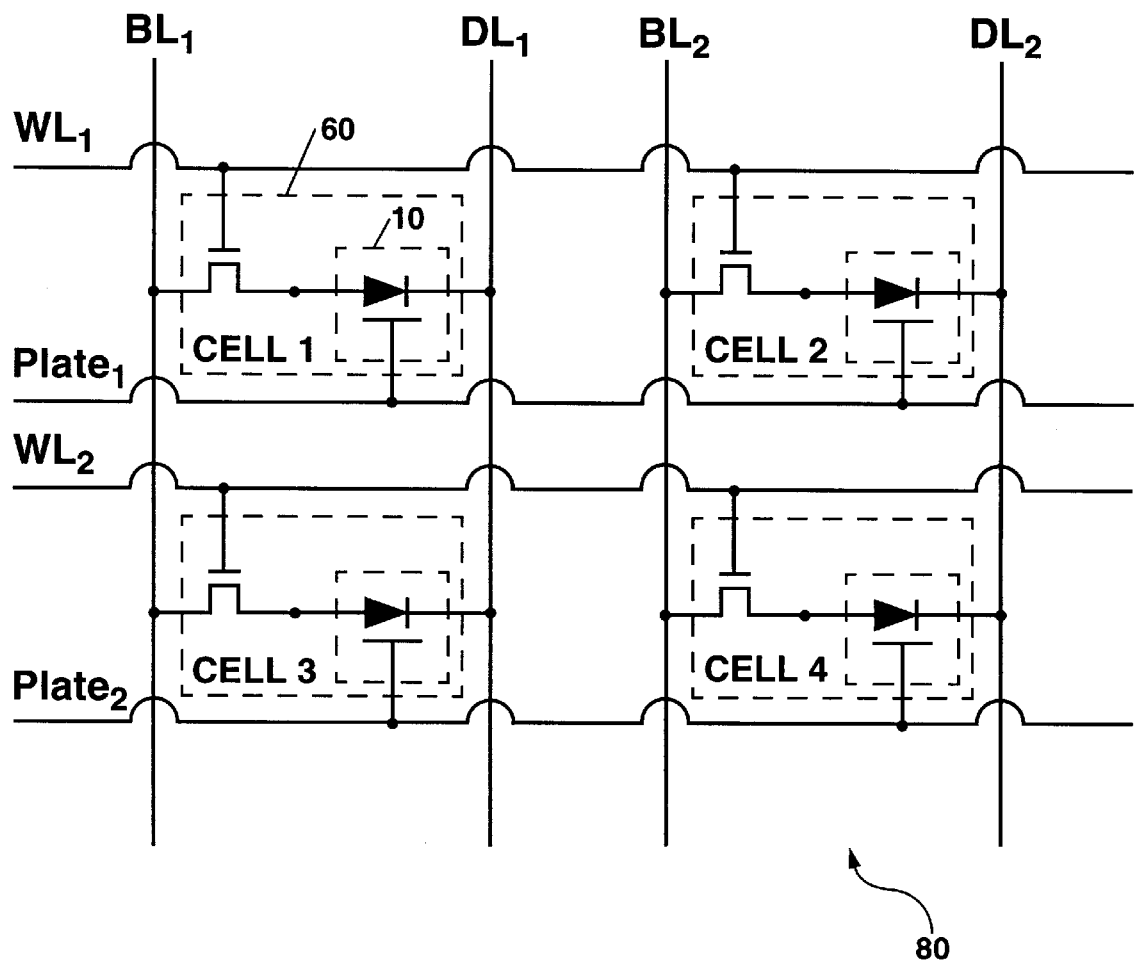
FIG. 5 illustrates four cells of an array of memory cells formed from the semiconductor switching devices of the present invention.

FIG. 5 shows an illustration of four cells of a memory array 80 for the storage of information formed from a plurality of semiconductor switching devices 10 of the present invention. The example of FIG. 5 is only for the purpose of illustration. The memory array 80 may also be a part of an IC having other functionalities (for example, the IC may include control logic or may be a microcontroller including a memory array 80).

To write a cell 1 of the memory array 80 in FIG. 5, a programming voltage of about the power supply voltage (i.e. about 5 volts) is applied between the bit line connection $BL_1$ and the plate connection ($Plate_1$), with the access transistor 62 turned on by means of a voltage applied to the word line connection $WL_1$. During the write cycle, the drive line connection $DL_1$ is kept electrically floating (i.e. in an electrically non-conducting state) to prevent any current flow through the diode in the semiconductor switching device 10 and to place the entire programming voltage across the electric field generating layer 22. Additional access transistors 62 not shown in FIG. 5 are preferably used to address the word, bit, drive, and plate lines connecting the lines to a power supply voltage or an electrical ground (i.e. at 0 volts), or to place them in an electrically non-conducting state.

The polarity of the programming voltage, in the preferred embodiment of the invention having a ferroelectric layer 22, is chosen to align the polarization of the ferroelectric layer in the direction corresponding to the logic state to be written in cell 1. As illustrated in the discussion of FIG. 2, a polarization direction resulting in a relatively large current flow at a given diode bias voltage may be used, for example, to represent a logical "1" state; and a polarization state resulting in a relatively low current flow at the same diode bias voltage may, in this example, represent a logical "0" state.

During a write operation to cell 1, the memory states of the other column 1 cells (i.e. cell 3 in FIG. 5) are not disturbed since their access transistors 62 are off (i.e. no voltage is applied to $WL_2$ in FIG. 5), and no voltage is applied to $Plate_2$. Also, during the write operation to cell 1, the column 2 cells (i.e. cells 2 and 4 in FIG. 5) are not disturbed since their bit line ($BL_2$) is held at the same electrical potential as $Plate_1$, and the drive line ($DL_2$) is electrically floating. In this manner, the other cells 2, 3, and 4 in FIG. 5 are not written or erased while cell 1 is uniquely selected among the cells 1 to 4 and written.

To read cell 1 of the memory array 80 in FIG. 5, the forward-bias characteristic of the rectifying junction 14 is determined. This may be done, for example, by momentarily pulsing a voltage across $BL_1$ and $DL_1$ in the forward direction of conduction of the rectifying junction 14, with a voltage applied to $WL_1$ to turn on the access transistor 62 in cell 1. (During the read operation to cell 1, no voltage is applied to WL2 so that the access transistor in cell 3 is off, and $BL_2$ and $DL_2$ are electrically floating or held at the same electrical potential so that cells 2 and 4 are not read.) The logic state in cell 1 is read from a measurement of the forward-bias current flow through the semiconductor switching device 10 as previously described with reference to FIG. 2. During the read operation to cell 1, $Plate_1$ is electrically floating (or at a sufficiently low voltage with respect to $BL_1$) so that the polarization state of the ferroelectric material 22 in cell 1 is not altered (i.e. a nondestructive readout).

Although the discussion heretofore has been simplified in that only a single memory cell 60 of the array 80 has been addressed, data may be written to the array or read from it in the form of multiple columns or word bytes (where a byte, for example, may be 8 bits wide or multiples thereof). In the case of multi-column addressing of the array 80 such as this, it is preferable to use a two-cycle process. In the first cycle, all the memory cells to be written in the same logic state (for example, the logical "1" state) in a byte-long row of memory cells 60 are addressed with appropriate bit line and plate voltages as previously discussed; while the bit line and plate connections of the bits that are not to be written during this cycle (i.e. those bits to be written in the opposite logic state during the second write cycle) are set at the same electrical potential. In the second clock cycle, all the memory cells to be written in the opposite logic state (a logical "0" state in this example) are addressed with appropriate bit line and plate voltages; while the bit line and plate connections of the bits written during the first cycle are set at the same electrical potential. During each cycle, appropriate bias conditions as described above are used to prevent disturbing the memory cells that are not being written. The read operation may be performed in a similar manner with a byte-long data word read with individual sense devices to measure the state of each column or bit line during a single cycle.

While the present invention has been described in terms of embodiments utilizing ferroelectric materials, it will be apparent to those skilled in the art that other polarizable materials may be utilized. For example, the electric field generating layer 22 may be an insulating layer having a stored electrical charge produced by a tunneling current.

What is claimed is:

1. A semiconductor apparatus comprising:
   (a) a semiconductor substrate of a first conductivity type, the substrate having a device surface;
   (b) a patterned insulating layer formed on the device surface having at least one region of access to the semiconductor substrate;
   (c) a patterned electrically conductive material in contact with the semiconductor substrate in an access region, the electrically conductive material in combination with the semiconductor substrate forming a rectifying junction with a conduction characteristic;
   (d) a pair of electrodes connected to opposite sides of the rectifying junction, with a first electrode being connected to the semiconductor substrate and a second electrode being connected to the patterned electrically conductive material; and
   (e) at least one electric field generating layer deposited over the patterned conductive material in the vicinity of the rectifying junction, the at least one electric field generating layer having a third electrode connected thereto.

2. The semiconductor apparatus in claim 1 in which the at least one electric field generating layer is formed from a ferroelectric material.

3. The semiconductor apparatus in claim 2 in which the ferroelectric material has at least one polarization state with an electric field component that alters the conduction characteristic of the rectifying junction.

4. The semiconductor apparatus in claim 3 in which the ferroelectric material is chosen from the group consisting of barium-titanates, bismuth-titanates, barium-magnesium-titanates, lead-titanates, lead-zirconate-titanates, and lead-lanthanum-zirconate-titanates and combinations thereof.

5. The semiconductor apparatus in claim 3 in which the patterned conductive material is a semiconductor with a second conductivity type opposite that of the substrate and in contact with the substrate forming a p-n rectifying junction.

6. The semiconductor apparatus in claim 3 in which the patterned conductive material in contact with the substrate forms a Schottky-barrier rectifying junction.

7. The semiconductor apparatus in claim 5 in which the patterned conductive material is chosen from the group consisting of semiconductors, metals, conductive metal oxides, and conductive metal silicides.

8. A switching circuit comprising:

(a) a semiconductor substrate of a first conductivity type, the substrate having a device surface;

(b) a patterned insulating layer formed on the device surface having at least one region of access to the semiconductor substrate;

(c) a patterned electrically conductive material in contact with the semiconductor substrate in an access region, the electrically conductive material in combination with the semiconductor substrate forming a rectifying junction with a conduction characteristic;

(d) a pair of electrodes connected to opposite sides of the rectifying junction, with a first electrode being connected to the semiconductor substrate and a second electrode being connected to the patterned electrically conductive material;

(e) means for applying an electrical potential across the rectifying junction to bias the rectifying junction in a forward direction of conduction;

(f) at least one electric field generating layer deposited over the patterned conductive material in the vicinity of the rectifying junction, the at least one electric field generating layer having a third electrode connected thereto; and (g) means for applying a programming signal across the electric field generating layer to establish an electric field component whereby the forward conduction characteristic of the rectifying junction is altered.

9. The switching circuit in claim 8 in which the at least one electric field generating layer is formed from a ferroelectric material.

10. The switching circuit in claim 9 in which the ferroelectric material has at least one polarization state with a remanent electric field component, a particular polarization state being selected by the programming signal.

11. The switching circuit in claim 10 in which the patterned conductive material in contact with the substrate forms a p-n rectifying junction.

12. The switching circuit in claim 10 in which the patterned conductive material in contact with the substrate forms a Schottky-barrier rectifying junction.

13. The switching circuit in claim 10 in the form of a memory element having in one polarization state a forward conduction characteristic and in a second polarization state a substantially different forward conduction characteristic.

14. An array of memory elements as in claim 13, the array further comprising means for addressing the individual memory elements.

15. The array in claim 14 in the form of an integrated circuit.

16. Apparatus for the storage of information comprising:

(a) a plurality of isolated semiconductor switching devices formed on a semiconductor substrate, each semiconductor switching device further comprising a diffusion region formed in the semiconductor substrate; a patterned insulating layer formed on a device surface of the semiconductor substrate and having a region of access to the diffusion region; a patterned electrically conductive material in contact with the diffusion region in the region of access forming a rectifying junction with a conduction characteristic; a pair of electrodes connected to opposite sides of the rectifying junction; and a patterned electric field generating region deposited over the conductive material in the vicinity of the rectifying junction and having a third electrode connected thereto;

(b) a programming means for addressing the electric field generating region of each semiconductor switching device to write a memory state therein; and (c) a readout means for addressing the rectifying junction of each semiconductor switching device to read a memory state therefrom.

17. The apparatus in claim 16 in which the electric field generating regions are formed from a ferroelectric material.

18. The apparatus in claim 17 in which the memory state of each switching device is determined by the conduction characteristic of the rectifying junction therein, the conduction characteristic being altered by a remanent polarization state of the ferroelectric material.

19. The apparatus in claim 18 in which the rectifying junction is a semiconductor p-n junction.

20. The apparatus in claim 18 in which the rectifying junction is a Schottky-barrier junction.

21. The apparatus in claim 18 in the form of an integrated circuit.

\* \* \* \* \*